(12) United States Patent
Taufer et al.

(10) Patent No.: US 10,930,577 B2
(45) Date of Patent: Feb. 23, 2021

(54) DEVICE FOR COOLING ELECTRICAL COMPONENTS

(71) Applicant: Robert Bosch GmbH, Stuttgart (DE)

(72) Inventors: Peter Taufer, Renningen (DE); Stefan Butzmann, Schalksmühle (DE); Bernd Eckert, Vaihingen an der enz (DE)

(73) Assignee: Robert Bosch GmbH, Stuttgart (DE)

( * ) Notice: Subject to any disclaimer, the term of this patent is extended or adjusted under 35 U.S.C. 154(b) by 372 days.

(21) Appl. No.: 15/754,925

(22) PCT Filed: Jun. 21, 2016

(86) PCT No.: PCT/EP2016/064257
§ 371 (c)(1),
(2) Date: Feb. 23, 2018

(87) PCT Pub. No.: WO2017/032477
PCT Pub. Date: Mar. 2, 2017

(65) Prior Publication Data
US 2020/0243415 A1    Jul. 30, 2020

(30) Foreign Application Priority Data
Aug. 24, 2015 (DE) .................... 10 2015 216 102.1

(51) Int. Cl.
*H01L 23/40* (2006.01)
*H05K 7/20* (2006.01)

(52) U.S. Cl.
CPC ......... *H01L 23/4006* (2013.01); *H05K 7/209* (2013.01); *H01L 2023/4031* (2013.01);
(Continued)

(58) Field of Classification Search
CPC ... H01L 23/4006; H01L 23/433; H01L 23/34; H01L 23/4338; H01L 2224/16;
(Continued)

(56) References Cited

U.S. PATENT DOCUMENTS 4,884,167 A    11/1989 Mine
5,036,384 A *  7/1991 Umezawa
(Continued)

FOREIGN PATENT DOCUMENTS

CN              203934232 U    11/2014
DE    10 2011 088 218 A1     6/2013
(Continued)

OTHER PUBLICATIONS

International Search Report corresponding to PCT Application No. PCT/EP2016/064257, dated Sep. 26, 2016 (German and English language document) (7 pages).

*Primary Examiner* — Thinh T Nguyen
(74) *Attorney, Agent, or Firm* — Maginot, Moore & Beck LLP

(57) ABSTRACT

A device for cooling a plurality of electrical components, each having a component cooling surface to be cooled, includes a first heat sink, a second heat sink, and a plurality of fasteners. The first heat sink has a first heat-sink cooling surface, and the second heat sink has a second heat-sink cooling surface. The first and second heat-sink cooling surfaces are positioned in a planar arrangement such that the first and second heat-sink cooling surfaces face each other. The first heat-sink cooling surface is configured to receive a first sub-set of the component cooling surfaces of the plurality of electrical components, and the second heat-sink cooling surface is configured to receive a second sub-set of the component cooling surfaces. The fasteners are configured to fasten the first and second heat-sink cooling surfaces to the corresponding component cooling surfaces of the plurality of electrical components to be applied.

7 Claims, 3 Drawing Sheets

(52) U.S. Cl.
CPC .............. *H01L 2023/4081* (2013.01); *H01L 2023/4087* (2013.01)

(58) Field of Classification Search
CPC ........... H01L 23/40; H01L 2924/01079; H01L 2924/1029
USPC ......... 257/718, 706, 723; 438/117, 109, 110
See application file for complete search history.

(56) References Cited

U.S. PATENT DOCUMENTS

| | | |
|---|---|---|
| RE35,721 E | 2/1998 | Daikoku et al. |
| 2002/0159237 A1 | 10/2002 | Patel et al. |
| 2005/0040515 A1 | 2/2005 | Inoue et al. |

FOREIGN PATENT DOCUMENTS

| | | |
|---|---|---|
| DE | 10 2012 206 407 A1 | 10/2013 |
| WO | 2014/132399 A1 | 9/2014 |

* cited by examiner

DEVICE FOR COOLING ELECTRICAL COMPONENTS

This application is a 35 U.S.C. § 371 National Stage Application of PCT/EP2016/064257, filed on Jun. 21, 2016, which claims the benefit of priority to Serial No. DE 10 2015 216 102.1, filed on Aug. 24, 2015 in Germany, the disclosures of which are incorporated herein by reference in their entirety.

The disclosure relates to a device for cooling a multiplicity of electrical components. Moreover, the disclosure relates to a power module for controlling an electric drive, and also to an inverter having a power module.

BACKGROUND

Inverters that convert electrical energy from a direct voltage source, for example a battery, into an alternating voltage or alternating current are conventionally used to operate electric drives. The alternating voltage is supplied to an electric machine, by way of example a synchronous or asynchronous machine. An inverter comprises power modules that comprise switching elements or semiconductor power switches. The prevailing direct voltage is converted into alternating voltage by means of a pulse width modulated control of the switching elements. These switching elements become hot when the inverter is being operated. In order to avoid the switching elements overheating and to extend their serviceable life, said switching elements or rather also the power modules are cooled.

DE 10 2011 088 218 A1 discloses an electronic power module that comprises a cooling element for cooling the switching elements of the power module so as to cool the semiconductor chips or semiconductor power switches.

There is a need to reduce the size of such cooling devices and power modules and to increase their packing density and power density.

SUMMARY

A device for cooling a multiplicity of electrical components is provided, wherein the electrical components each comprise a component cooling surface that is to be cooled. The device comprises a first cooling body having a first cooling body cooling surface, and a second cooling body having a second cooling body cooling surface. The cooling body cooling surfaces are arranged in a planar manner opposite one another. In accordance with the disclosure, the first cooling body cooling surface is configured for attaching a first part quantity of the component cooling surfaces of the multiplicity of electrical components. Furthermore, the second cooling body cooling surface is configured for attaching a second part quantity of the component cooling surfaces of the multiplicity of electrical components. Furthermore, fastening means are provided for fastening and pressing the component cooling surfaces, which are to be attached, of the multiplicity of electrical components against the cooling body cooling surfaces and for creating and maintaining a heat transfer from the said component cooling surfaces that are to be attached.

A device for cooling a multiplicity of electrical components is provided. The electrical components are in particular switching elements that are used by way of example to convert a direct voltage into an alternating voltage, in other words in particular semiconductor power switches. These electrical components that are manufactured in particular as semiconductor chips from silicon wafers comprise a planar surface that is suitable as a contact surface for the cooling procedure. Within the scope of this disclosure, the term 'component cooling surface' also includes this planar surface of the semiconductor chip. However, the term also includes a layer that is applied where appropriate in addition to the semiconductor chip. The device in accordance with the disclosure comprises a first and a second cooling body that each comprise in turn cooling body cooling surfaces that are arranged in a planar manner opposite one another. The cooling body cooling surfaces are configured in such a manner that it is possible in each case to attach a part quantity of component cooling surfaces of the electrical components. In particular, the first cooling body and the second cooling body can be a part body of a one piece cooling body, such as also in particular the cooling body cooling surfaces part surfaces of a one piece cooling body. Furthermore, fastening means are provided, in particular mechanical fastening means that render it possible to fasten the component cooling surfaces to the cooling body cooling surfaces. The fastening means are configured in such a manner that a heat transfer from the components into the cooling body is ensured, in that in particular the component cooling surfaces are pressed against the cooling body cooling surfaces.

Consequently, a device for cooling a multiplicity of electrical components is advantageously provided, said device rendering possible a high packing density by virtue of the fact that it is possible to attach the multiplicity of electrical components to the opposite-lying cooling body cooling surfaces.

It is provided in another embodiment of the disclosure that a cooling body cooling surface is configured as an at least in part planar surface.

It is thus possible to produce as large as possible surface area contact between the component cooling surfaces and the cooling body cooling surface. Consequently, the transmission of heat between the component and the cooling body is advantageously optimized.

It is provided in another embodiment of the disclosure that the first and the second cooling body cooling surface is configured for attaching a part quantity of the component cooling surfaces of the multiplicity of electrical components in such a manner that approximately half of the multiplicity of electrical components that are to be attached can be attached to each of the first and second cooling body cooling surfaces.

In each case, approximately half of the multiplicity of the required electrical components can consequently be attached to the first and the second cooling body cooling surface. The cooling body cooling surfaces are arranged in a planar manner lying opposite one another. Consequently, the amount of surface area required is advantageously more or less halved in comparison to the surface area that would be required when the components are cooled on one side or rather on one layer.

In another embodiment of the disclosure, the fastening means are configured in the form of a resilient element.

A resilient element can be configured by way of example from a metal or a synthetic material. However, it is also possible to use resilient elements that are configured from other materials, such as by way of example fiber composite materials, glass fibers or carbon fibers or ceramic compounds. The resilient element can be configured by way of example in a spiral shape, a c-shape or in a clamp shape. The use of a resilient element as a fastening means causes the electrical components to be pressed against the cooling body. As a result of this pressing arrangement, heat is transmitted from the component to the cooling body in an optimum manner. Furthermore, the resilient element is able to balance with respect to one another and compensate for any temperature-related stresses and separating out of the materials that are used within this device.

In another embodiment of the disclosure, a fastening means is configured in such a manner that in the form of a resilient element it can be supported on the one hand on a first component surface of an electronic component, said first component surface lying opposite the component cooling surface, and on the other hand it can be supported on a cooling body cooling surface that is lying opposite the first component surface, on a second component surface of a further electrical component, said second component surface lying opposite the first component surface, or on a mechanical fixing point that lies opposite the first component surface. A fastening means is provided that is configured in the form of a resilient element, in particular in the form of a spring. This fastening means is supported on a first component surface of an electronic component, said first component surface lying opposite the component cooling surface, wherein in particular the resilient force is directed to the greatest extent in an orthogonal manner to the component cooling surface. The face of the fastening means that is lying opposite in the direction of the resilient force is supported either on a cooling body cooling surface that lies opposite the first component surface or is supported on a second component surface of a further electrical component, said second component surface lying opposite the first component surface. In the second case, two electronic components are consequently arranged at least in part one above the other. Furthermore, the fastening means can be supported with the other end that is lying opposite in the direction of the resilient force on a mechanical fixing point that is lying opposite the first component surface. This fixing point may be a passive or active element, in particular an electronic component. This fixing point can comprise different, suitable materials, such as by way of example metal, fiber composite material, glass fibers or carbon fibers or ceramic compounds.

In an advantageous manner, variants of how the fastening means can be supported in order to press the component against the cooling body are proposed.

In another embodiment of the disclosure it is provided that a fastening means is configured in such a manner that it clamps the component cooling surface of the electronic component and the cooling body cooling surface against one another or rather pulls said surfaces towards one another.

A fastening means is provided that is tensioned by way of example in a bow-shaped manner over a component and fixed on both sides of the component to the cooling body. In an advantageous manner, a fastening means is consequently provided that does not require mechanical support on a surface that is lying opposite the cooling body cooling surface.

In a further embodiment of the disclosure, it is provided that a fastening means comprises a screw or a rivet. The component may be fixed to the cooling body by way of example by means of a screw or a rivet. The fastening means may also be fixed to a cooling body or the cooling body cooling surface by way of example by means of a screw or a rivet. In an advantageous manner, variants are provided that ensure that the fastening means is fixed in a reliable and secure manner.

In another embodiment of the disclosure, it is provided that the cooling body cooling surfaces are configured for attaching a part of the component cooling surfaces of the multiplicity of electrical components in such a manner that electrical components can be attached positioned adjacent to one another along a straight line in one plane, wherein a component cooling surface of a first electrical component can be attached to the first cooling body cooling surface and alternately a component cooling surface of a further electrical component can be attached to the second cooling body cooling surface. By virtue of attaching the electrical components in this alternating manner to the upper and the lower cooling body cooling surface, this means that the cooling body cooling surface comprises part regions that are not attached to an electrical component. In an advantageous manner, this consequently provides the cooling body with a comparatively higher cooling capacity.

In another embodiment of the disclosure, it is provided that the cooling body cooling surfaces are configured for attaching a part quantity of component cooling surfaces of the multiplicity of electrical components in such a manner that a first and a second electrical component can be attached in two planes one above the other, wherein a component cooling surface of the first electrical component can be attached to the cooling body cooling surface of the first cooling body, and a component cooling surface of a second electrical component can be attached to the cooling body cooling surface of the second cooling body.

This means that the components are arranged one above the other. One of the components is cooled in the direction of the first cooling body, and a second component is cooled in the direction of the second cooling body. This arrangement of the components and the cooling bodies with respect to one another produces a particularly high packing density of the components.

Moreover, a power module is provided for controlling an electric drive. The power module comprises a device as described above for cooling the attached multiplicity of electrical components, in particular switching elements and/or semiconductor power switches. A power module is provided that in addition to the multiplicity of electrical components comprises a device as described above for cooling the electrical components. In an advantageous manner, a power module that comprises a high packing density and power density is provided.

Moreover, an inverter is provided that comprises a power module as described above. In an advantageous manner, an inverter that comprises a high packing density and power density is provided.

It is understood that the features, characteristics and advantages of the device in accordance with the disclosure relate accordingly to the power module or the inverter and conversely or can be used therewith.

Further features and advantages of the embodiments of the disclosure are disclosed in the following description with reference to the attached drawings.

BRIEF DESCRIPTION OF THE DRAWINGS

The disclosure is to be further explained in the following with reference to some figures, in which.

DETAILED DESCRIPTION

Figure 1:
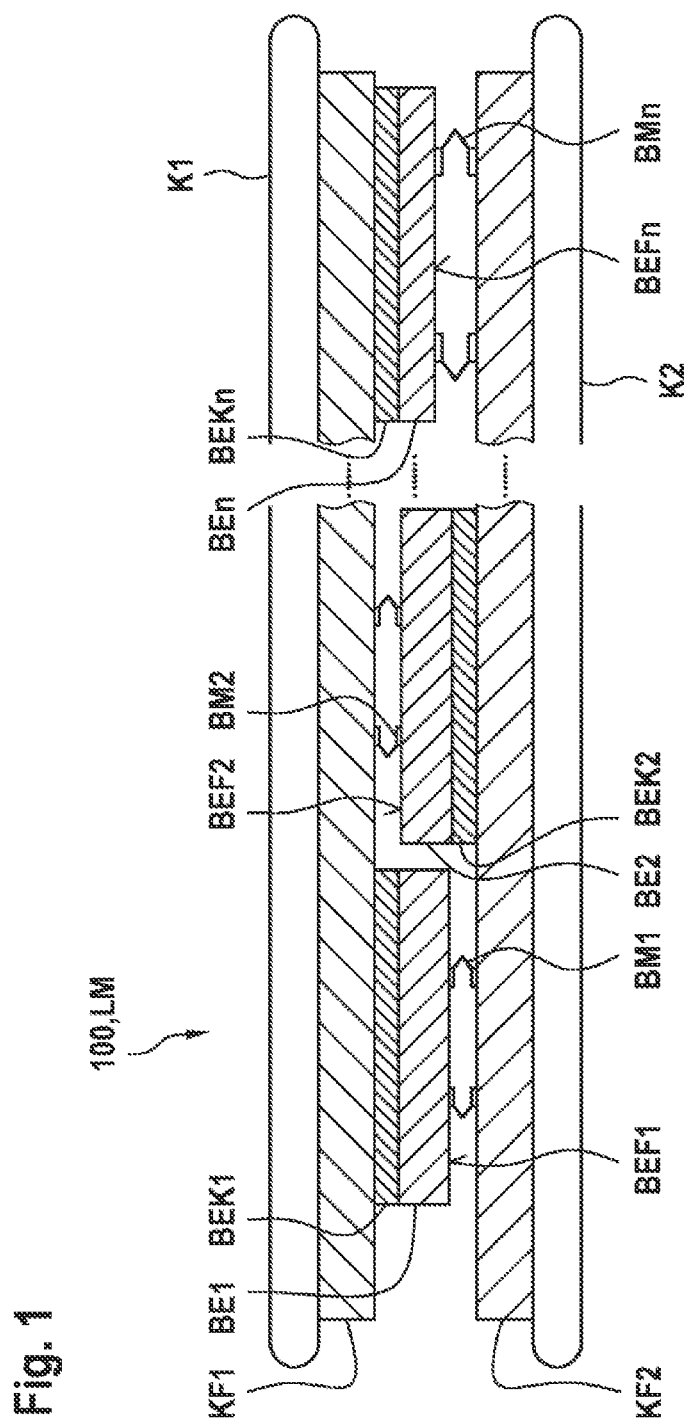
FIG. 1 illustrates schematically a device for cooling a multiplicity of electrical components in a schematic view, FIG. 2 likewise illustrates schematically a device for cooling a multiplicity of electrical components.

FIG. 1 illustrates schematically a device 100 or a section of a power module, comprising a first cooling body K1 having a first cooling body cooling surface KF1, and a second cooling body K2 having a second cooling body cooling surface KF2 that is arranged lying opposite and spaced apart in a planar manner to the first cooling body cooling surface KF1. Furthermore, a multiplicity of electrical components BE1, BE2 . . . BEn is illustrated in an exemplary manner. The individual components comprise in each case a component cooling surface BEK1, BEK2 . . . BEKn. Furthermore, fastening means BM1, BM2 . . . BMn are illustrated that are supported on the one hand on the component surfaces BEF1, BEF2 . . . BEFn of the multiplicity of electrical components, said component surfaces being arranged opposite the component cooling surfaces BEK1, BEK2 . . . BEKn, and supported on the other hand on the opposite-lying cooling body cooling surface KF1, KF2.

Figure 2:
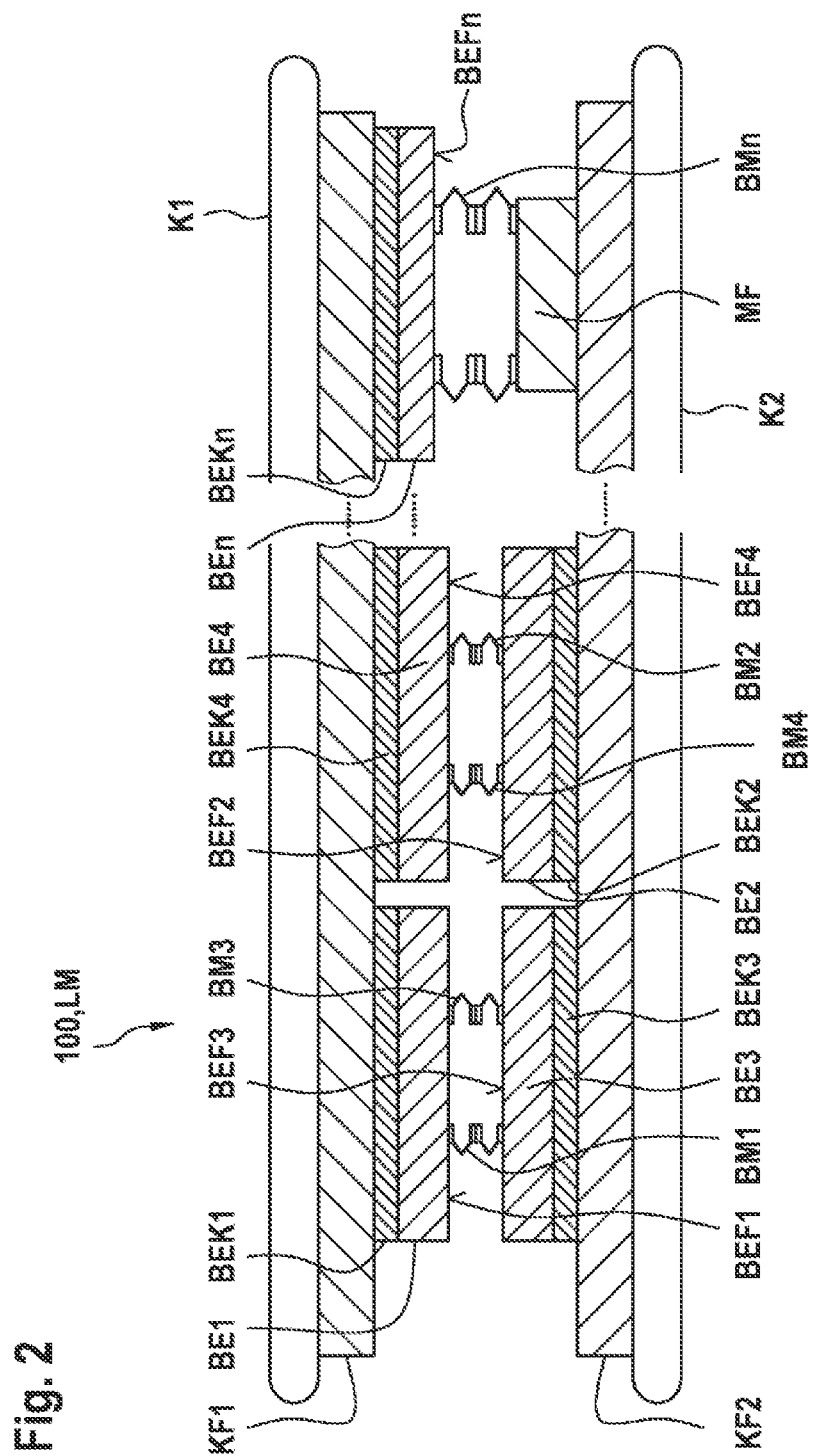

FIG. 2 illustrates schematically a similar construction of the cooling body K1, K2 and the associated cooling body cooling surfaces KF1 and KF2, and opposite-lying components BE1, BE3 or respectively BE4, BE2. The illustrated fastening means BM1, BM2, BM3, BM4 are supported on the one hand on the first component surface BEF1, BEF2, BEF3, BEF4 of the electronic components BE1, BE2, BE3, BE4, said first component surface lying opposite the component cooling surface BEK1, BEK2, BEK3, BEK4, and supported on the other hand on the second component surface, BEF1, BEF2, BEF3, BEF4 of a further electrical component, said second component surface lying opposite the first component surface BEF1, BEF2, BEF3, BEF4. Furthermore, a fastening means BMn is illustrated that is supported on the one hand on a first component surface BEFn of the electronic component BEn, said first component surface lying opposite the component element cooling surface BEKn, and on a mechanical fixing point MF that lies opposite the first component surface BEFn. It is also possible to support opposite-lying fastening means, such as by way of example BM1 and BM3, against one another between the components. Alternatively, two opposite-lying fastening means, such as by way of example BM2 and BM4, may also be configured in one piece as a common fastening means.

Figure 3:
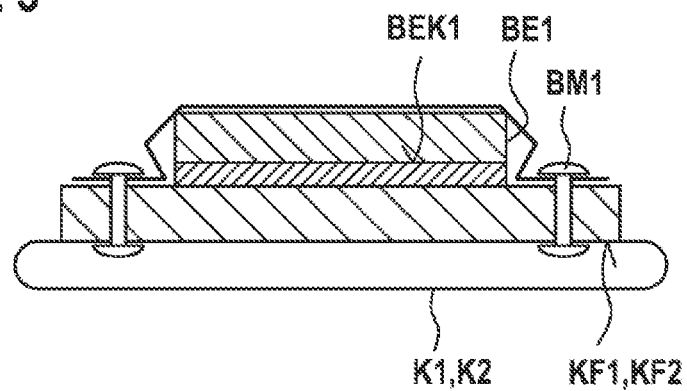
FIG. 3 illustrates a fastening means that is fixed to a cooling body.

FIG. 3 illustrates a cooling body K1, K2 having a cooling body cooling surface KF1, KF2 and a component BE1 that is attached thereto and comprises a component cooling surface BEK1, wherein a fastening means BM1 in the form of a resilient clamp is illustrated around the component BE1 that is fixed by means of a screw or a rivet to the cooling body K1, K2.

Figure 4:
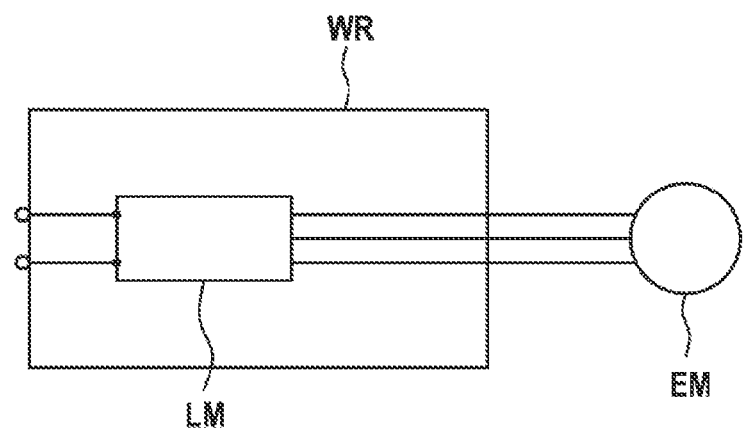
FIG. 4 illustrates an inverter having a power module for supplying an electric machine.

FIG. 4 illustrates a schematic view of an inverter WR that comprises at least one power module LM that is used to control an electric machine EM.

The invention claimed is:

1. A device for cooling a plurality of electrical components each component having a cooling component cooling surface, the device comprising:

a first cooling body including a first cooling body cooling surface configured receive a first sub-set of the component cooling surfaces of the plurality of electrical components; and a second cooling body including a second cooling body cooling surface,
the second cooling body positioned in a planar arrangement with the first cooling body such that the first cooling body cooling surface and the second cooling body cooling surface are opposite each other, and
the second cooling body cooling surface configured to receive a second sub-set of the component cooling surfaces of the plurality of electrical components; and a fastening mechanism configured to fasten the first and second sub-sets of the component cooling surfaces to the first and second cooling body cooling surfaces, respectively, wherein each of the first and second the cooling body cooling surfaces is further configured to receive the first and second sub-sets of component cooling surfaces of the plurality of electrical components, respectively, in positions such that the electrical components on each of the first and second cooling body surfaces are positioned adjacent to each other along a straight line in one plane, and such that a component cooling surface of a first electrical component is attached to the first cooling body cooling surface and a component cooling surface of a further electrical component is-attached to the second cooling body cooling surface.

2. The device as claimed in claim 1, wherein at least one of the first and second cooling body cooling surfaces is configured as a planar surface, at least in part.

3. The device as claimed in claim 1, wherein the first and second cooling body cooling surfaces are configured to receive approximately half of the plurality of electrical components.

4. The device as claimed in claim 1, wherein fastening mechanism includes a resilient element.

5. The device as claimed in claim 3, wherein the fastening mechanism is configured such that in a fastened position, the fastening mechanism is:

supported on a first component surface of an electronic component, the first component surface lying opposite the first and second component cooling surfaces;

supported on a one of the cooling body cooling surfaces that is lying opposite the first component element;

supported on a second component surface of a further electrical component, the second component surface lying opposite the first component surface; or supported on a mechanical fixing point that lies opposite the first component surface.

6. The device as claimed in claim 1, wherein the fastening mechanism is further configured to clamp the first and second sub-sets of component cooling surface of the electronic component and the first and second cooling body cooling surface against each other, respectively.

7. The device as claimed in claim 1, wherein the fastening mechanism includes a screw or a rivet.

* * * * *